US012266738B2

(12) United States Patent
Li et al.

(10) Patent No.: US 12,266,738 B2
(45) Date of Patent: Apr. 1, 2025

(54) DRIVING BACKPLANE, DISPLAY PANEL AND DISPLAY APPARATUS

(71) Applicant: BOE Technology Group Co., Ltd., Beijing (CN)

(72) Inventors: Haixu Li, Beijing (CN); Mingxing Wang, Beijing (CN); Guangcai Yuan, Beijing (CN); Zhanfeng Cao, Beijing (CN); Ke Wang, Beijing (CN); Feng Qu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 846 days.

(21) Appl. No.: 17/407,919

(22) Filed: Aug. 20, 2021

(65) Prior Publication Data

US 2022/0131044 A1     Apr. 28, 2022

(30) Foreign Application Priority Data

Oct. 23, 2020    (CN) .......................... 202011145530.7

(51) Int. Cl.
*H01L 33/38*      (2010.01)
*H01L 25/075*     (2006.01)
(Continued)

(52) U.S. Cl.
CPC .......... *H01L 33/38* (2013.01); *H01L 25/0753* (2013.01); *H01L 27/156* (2013.01); *H01L 33/62* (2013.01)

(58) Field of Classification Search
CPC .................................................. H01L 21/0216
See application file for complete search history.

(56) References Cited

U.S. PATENT DOCUMENTS 11,264,582 B2 * 3/2022 Lin ...................... H10K 50/115
2005/0236629 A1 * 10/2005 Lee ................... H10K 59/80522
257/79

(Continued)

FOREIGN PATENT DOCUMENTS

CN          104471698 A      3/2015
CN          109755266 A      5/2019
(Continued)

OTHER PUBLICATIONS

CN202011145530.7 first office action.

*Primary Examiner* — Mounir S Amer
(74) *Attorney, Agent, or Firm* — IPro, PLLC (57) ABSTRACT

A driving backplane, a display panel and a display apparatus are provided. The driving backplane includes: a base substrate, and a plurality of connection electrode groups and a plurality of correction structures disposed on the base substrate, each of the connection electrode groups includes: a first connection electrode and a second connection electrode the first connection electrode and the second connection electrode are arranged on a same layer; a first gap is formed between the first connection electrode and the second connection electrode, and a first group of opposite edges includes: an edge, close to the first gap, of the first connection electrode; and an edge, close to the first gap, of the second connection electrode; a second group of opposite edges includes: an edge, far away from the first gap, of the first connection electrode; and an edge, far away from the first gap, of the second connection electrode.

16 Claims, 8 Drawing Sheets

(51) Int. Cl.
*H01L 27/15* (2006.01)
*H01L 33/62* (2010.01)

(56) References Cited

U.S. PATENT DOCUMENTS

| | | |
|---|---|---|
| 2016/0064604 A1 | 3/2016 | Lin et al. |
| 2017/0122502 A1 | 5/2017 | Cok et al. |
| 2017/0148771 A1 | 5/2017 | Cha et al. |
| 2019/0319015 A1 | 10/2019 | Schuele et al. |
| 2020/0028028 A1 | 1/2020 | Tsai et al. |
| 2020/0280009 A1* | 9/2020 | Lin .................. H10K 59/35 |
| 2021/0043817 A1 | 2/2021 | Liang et al. |
| 2021/0233940 A1 | 7/2021 | Li et al. |
| 2021/0407830 A1 | 12/2021 | Ahn et al. |

FOREIGN PATENT DOCUMENTS

| | | |
|---|---|---|
| CN | 109904174 A | 6/2019 |
| CN | 110416248 A | 11/2019 |
| CN | 111033762 A | 4/2020 |
| CN | 111613632 A | 9/2020 |
| CN | 211605118 U | 9/2020 |
| JP | 2012109501 A | 6/2012 |
| KR | 20200053841 A | 5/2020 |
| WO | 2014008110 A1 | 1/2014 |

\* cited by examiner

DRIVING BACKPLANE, DISPLAY PANEL AND DISPLAY APPARATUS

CROSS-REFERENCE TO RELATED APPLICATION

This application claims priority to Chinese Patent Application No. 202011145530.7, filed by the China National Intellectual Property Administration on Oct. 23, 2020, the entire contents of which are incorporated herein by reference.

FIELD

The present disclosure relates to the field of display, in particular to a driving backplane, a display panel and a display apparatus.

BACKGROUND

An extra-small micro-LED may realize a high resolution more easily and is applicable to, for example, a display screen with the 4K or even 8K resolution. While response time of a display panel with an organic light-emitting diode (OLED) is in a microsecond precision level, response time of the micro-LED is in a nanosecond precision level. Furthermore, the micro-LED has greater advantages in the fields of a contrast ratio, a color gamut and a flexible display screen.

SUMMARY

The embodiments of the present disclosure provide a driving backplane, a display panel and a display apparatus.

In a first aspect, embodiments of the present disclosure provide a driving backplane, including:
  a base substrate;
  a plurality of connection electrode groups disposed on the base substrate; and
  a plurality of correction structures disposed on the base substrate;
  each of the connection electrode groups includes: a first connection electrode and a second connection electrode; and the first connection electrode and the second connection electrode are arranged on the same layer;
  a first gap is formed between the first connection electrode and the second connection electrode;
  a first group of opposite edges includes: an edge, close to the first gap, of the first connection electrode and an edge, close to the first gap, of the second connection electrode;
  a second group of opposite edges includes: an edge, far away from the first gap, of the first connection electrode and an edge, far away from the first gap, of the second connection electrode; and
  an orthographic projection, on the base substrate, of the each of the correction structures overlaps with an orthographic projection, on the base substrate, of one group of opposite edges, the one group of opposite edges is the first group of opposite edges or the second group of opposite edges;
  slope angles of the each of the correction structures at the one group of opposite edges are acute angles, and the each of the correction structures is configured to limit a first electrode and a second electrode of a micro-LED to a surface of the first connection electrode and a surface of the second connection electrode included in the each of the connection electrode groups respectively.

In one possible implementation, the plurality of correction structures are located on a side, facing away from the base substrate, of a layer where the plurality of connection electrode groups are arranged; and
  the orthographic projection, on the base substrate, of each of the correction structures is coincide with an orthographic projection, on the base substrate, of the first group of opposite edges and an orthographic projection, on the base substrate, of the first gap.

In one possible implementation, in the driving backplane provided by the embodiments of the present disclosure, in a direction orienting from the first connection electrode to the second connection electrode, a length of a bottom edge of a section, perpendicular to the base substrate, of the each of the correction structures is smaller than or equal to a sum of a doubled alignment accuracy of a photolithography device and the first gap, and a length of a top edge of the section is smaller than or equal to a difference value of a distance between the first electrode and the second electrode and a doubled maximum offset of falling; and a height of the each of the correction structures is smaller than or equal to a height of the first electrode and the height of the each of the correction structures is smaller than or equal to a height of the second electrode.

In one possible implementation, the driving backplane provided by the embodiments of the present disclosure further includes an insulation layer disposed between a layer where the plurality of correction structures are arranged and the layer where the plurality of connection electrode groups are arranged;
  the insulation layer is provided with a plurality of openings, and an orthographic projection, on the base substrate, of each of the openings is in an orthographic projection of the first connection electrode and an orthographic projection of the second connection electrode.

In one possible implementation, in the driving backplane provided by the embodiments of the present disclosure, the orthographic projection, on the base substrate, of the each of the correction structures covers an orthographic projection, on the bses substrate of the insulation layer at the first gap.

In one possible implementation, in the driving backplane provided by the embodiments of the present disclosure, the plurality of correction structures are between the base substrate and a layer where the plurality of connection electrode groups is arranged;
  the first connection electrode and the second connection electrode of one of the connection electrode groups are arranged on slope surfaces of two adjacent correction structures of the correction structures at the first gap respectively; and
  the orthographic projection, on the base substrate, of the each of the correction structures is coincide with an orthographic projection of the second group of opposite edges and an orthographic projection of a second gap between the two adjacent connection electrode groups.

In one possible implementation, in the driving backplane provided by the embodiment of the present disclosure, the first electrode is arranged on the first side, close to the first connection electrode, of the light emitting portion comprised in the micro-LED, and the second electrode is arranged on a second side, close to the second connection electrode, of the light-emitting portion, a first included angle between the first side and the base substrate is an acute angle, and a second include angle between the second side and the base substrate is an acute angle.

In one possible implementation, the first included angle is equal to the second included angle; and the slope angles of the correction structures at the one group of the opposite edges are equal to the first included angle and the second included angle.

In one possible implementation, in the driving backplane provided by the embodiments of the present disclosure, in a direction perpendicular to the base substrate, heights of the correction structures are equal to a height of the light-emitting portion.

In one possible implementation, in the driving backplane provided by the embodiments of the present disclosure, the slope angles of the each of the correction structures at the one group of opposite edges are larger than or equal to 15° and smaller than 90°.

In a second aspect, based on the same inventive concept, embodiments of the present disclosure further provide a display panel, including: a plurality of micro-LEDs and the above driving backplane; each of the plurality of micro-LEDs corresponds to each of the plurality of connection electrode groups.

In a third aspect, based on the same inventive concept, embodiments of the present disclosure further provide a display apparatus, including the above display panel.

DETAILED DESCRIPTION OF THE EMBODIMENTS

In order to make objectives, technical solutions and advantages of embodiments of the present disclosure clearer, the technical solutions of the embodiments of the present disclosure will be clearly and fully described in combination with the accompanying drawings of the embodiments of the present disclosure. It needs to be noted that sizes and shapes of all figures in the drawings do not reflect a true scale and are only intended to illustrate contents of the present disclosure. Same or similar reference numbers denote same or similar elements or elements with same or similar function all the time. Apparently, the described embodiments are only some, but not all of the embodiments of the present disclosure. Based on the described embodiments of the present disclosure, all other embodiments obtained by those ordinarily skilled in the art without creative work belong to the protection scope of the present disclosure.

Unless otherwise defined, technical or scientific terms used herein should be understood commonly by those ordinarily skilled in the art of the present disclosure. "First", "second" and other similar words used in the description and claims do not denote any sequence, quantity or significance, but are only used for distinguishing different components. "Include", "comprise" and other similar words mean that elements or items preceding the word cover elements or items and their equivalents listed after the word without excluding other elements or items. "Inner", "outer", "upper", "lower" and the like are only used for denoting a relative position relation, and when an absolute position of a described object changes, the relative position relation may change correspondingly.

The applicant found that there are two problems exist in a process that close micro-LEDs distributed in an array mode are lifted off from a growth substrate or a middle carrier substrate, transferred to a driving backplane and connected and bonded to the driving backplane: (1) as the micro-LEDs basically fall on the driving backplane in a mode of a free falling body after being lifted off from the growth substrate or the middle carrier substrate, theoretically, a certain position offset may exist between positions of the micro-LEDs falling on the driving backplane and an ideal falling point; and (2) before bonding connection of the micro-LEDs and the driving backplane through eutectic bonding, electrodes of the micro-LEDs are only in direct physical contact with and fixedly connected with connection electrodes of the driving backplane, in a process that the driving backplane with the micro-LEDs transferred thereto needs to be moved to an eutectic bonding device before eutectic bonding, displacement of relative positions between the micro-LEDs and the connection electrodes may still occur. On that account, a whole transferring yield of the micro-LEDs may be affected by the two problems.

Figure 1:
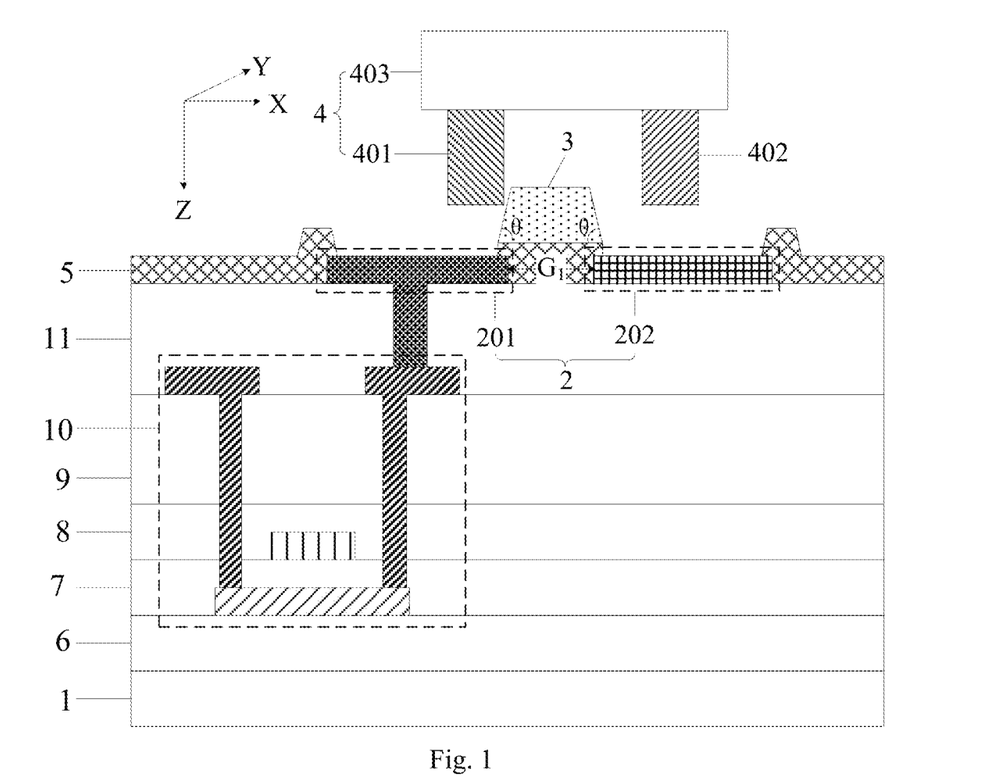
FIG. 1 is a schematic structural diagram of a driving backplane provided by an embodiment of the present disclosure.
Figure 2:
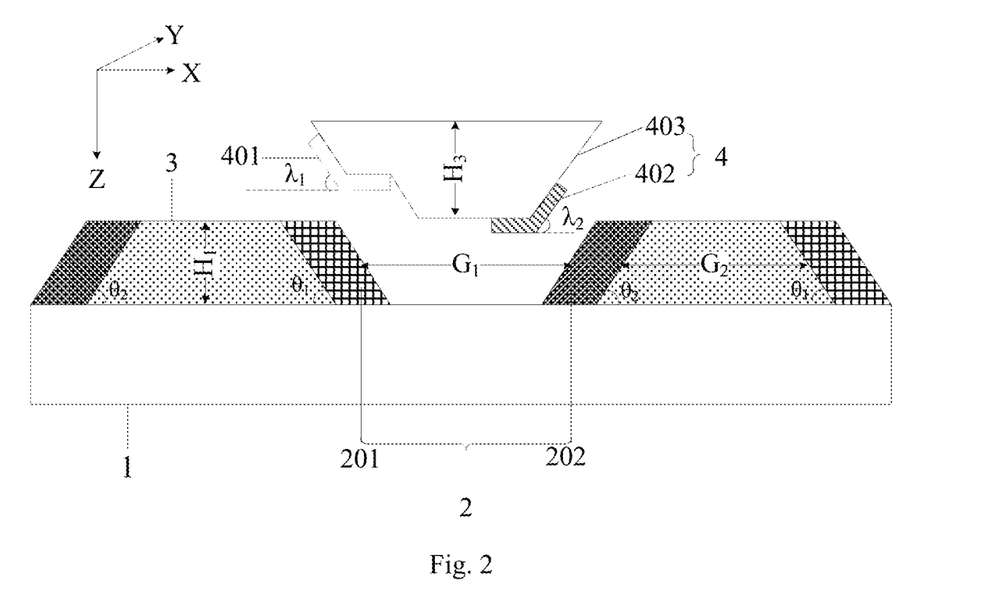
FIG. 2 is another schematic structural diagram of a driving backplane provided by an embodiment of the present disclosure.

In order to solve the above problems in the prior art, embodiments of the present disclosure provide a driving backplane, as shown in FIG. 1 and FIG. 2, including:
a base substrate 1;
a plurality of connection electrode groups 2 disposed on the base substrate 1; and
a plurality of correction structures 3 disposed on the base substrate 1;
each of the connection electrode groups 2 including: a first connection electrode 201 and a second connection electrode 202, and the first connection electrode and the second connection electrode are arranged on a same layer; a first gap $G_1$ is formed between the first connection electrode 201 and the second connection electrode 202, and a first group of opposite edges includes: an edge, closed to the first gap $G_1$, of the first connection electrode 201 and an edge, closed to the first gap $G_1$, of the second connection electrode 202, and a second group of opposite edges includes: an edge, far away from the first gap $G_1$, of the first connection electrode 201 and an edge, far away from the first gap $G_1$, of the second connection electrode 202; and
an orthographic projection, on the base substrate 1, of the each of the correction structures 3 overlaps with an orthographic projection, on the base substrate, of one group of opposite edges, the one group of opposite is the first group of opposite edges or the second group of opposite edges; and slope angles θ of the each of the correction structures 3 at the one group of opposite edges are acute angles, the each of the correction structures 3 is configured to limit a first electrode 401 and a second electrode 402 of a micro-LED 4 to a surface of the first connection electrode 201 and a surface of the second connection electrode 202 included in the each of the connection electrode groups 2 respectively.

In the above driving backplane provided by the embodiments of the present disclosure, the correction structures 3 with acute angle slopes are arranged at the one group opposite edges of the first connection electrodes 201 and the second connection electrodes 202. Thus, on the one hand, the micro-LED 4 may adopt the slopes of the correction structures 3 in a free falling process to compensate alignment accuracy of the middle carrier substrate and the driving backplane, and the first electrode 401 and the second electrode 402 of the micro-LED 4 are guided to the surface of the first connection electrode 201 and the surface of the second connection electrode 202 included in one of the connection electrode groups 2 respectively; besides, if the first electrode 401 and the second electrode 402 included in the micro-LED 4 has angle offset in a plane direction (namely, an X direction and a Y direction) of the driving backplane, the correction structures 3 may enable the first electrode 401 and the second electrode 402 included in the micro-LED 4 to be guided in position along slope edges of the correction structures 3; and on the other hand, after the first electrode 401 and the second electrode 402 included in the micro-LED 4 fall onto the driving backplane, the driving backplane may be moved in a vertical direction Z of a contact surface with the correction structures 3, and at the moment, because of a blocking effect of the correction structures 3, it may be guaranteed that the first electrode 401 and the second electrode 402 included in the micro-LED 4 do not deviate. Therefore, a transferring yield of the micro-LED 4 is effectively improved.

Figure 3:
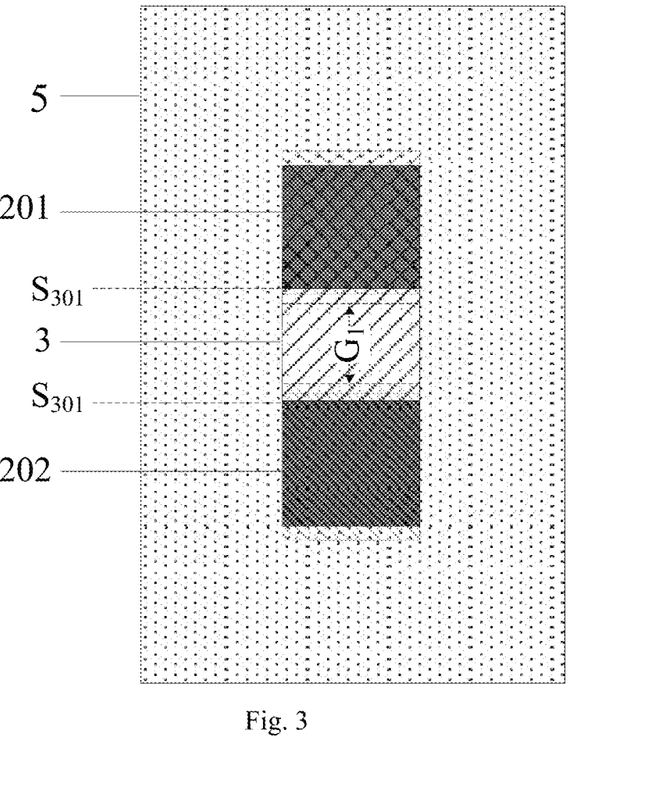
FIG. 3 is a schematic structural diagram of a region with one connection electrode group in the driving backplane shown in FIG. 1.

During specific implementation, in the above driving backplane provided by the embodiments of the present disclosure, as shown in FIG. 1 and FIG. 3, the plurality of correction structures 3 may be located on a side, facing away from the base substrate 1, of a layer where the plurality of connection electrode groups 2 are arranged.

The orthographic projection, on the base substrate 1, of each of the correction structures 3 in coincide with an orthographic projection, on the base substrate 1, of the first group of opposite edges and an orthographic projection, on the base substrate 1, of the first gap $G_1$.

An outline of each of the correction structures 3 is arranged to coincide with the first gap $G_1$ and the opposite edges close to the first gap $G_1$, for example, the first group of opposite edges or the second group of opposite edges, so that the correction structure 3 includes an edge $S_{301}$ of a slope surface to be in lap joint with the edge, close to the first gap $G_1$, of the first connection electrode 201 and the edge, close to the first gap $G_1$, of the second connection electrode 202. As the first electrode 401 and the second electrode 402 of the micro-LED 4 are both of a regular cube structure, when angle offset occurs to the micro-LED 4 in the plane direction (namely, the X direction and the Y direction) of the driving backplane, the first electrode 401 and the second electrode 402 may correct their angles along the regular edge $S_{301}$ of the correction structure 3.

Besides, due to a plurality of micro-LEDs 4 distributed in an array mode on the middle carrier substrate, at the moment, a shortest distance between the micro-LEDs 4 may be 2 μm to 5 μm, if an area of the orthographic projection of the correction structure 3 on the base substrate 1 exceeds an area of an orthographic projection of one of the micro-LEDs 4 on the base substrate 1, the adjacent micro-LEDs 4 may be squeezed by the correction structure 3 in an alignment process of making the middle carrier substrate approaching the driving backplane, but the correction structure 3 is only in a position between the first connection electrode 201 and the second connection electrode 202 included in the same connection electrode group 2, so that the adjacent micro-LEDs 4 may be effectively prevented from being squeezed due to a too large correction structure 3.

During specific implementation, in the above driving backplane provided by the embodiments of the present disclosure, in order to guarantee that each of the correction structures 3 may be in lap joint with the first gap $G_1$ and the opposite edges adjacent to the first gap $G_1$ and a contact area between the micro-LED 4 and the connection electrode group 2 is large, the correction structure 3 may cover the opposite edges adjacent to the first gap G1 in a lap joint mode on the basis of alignment accuracy (e.g., 0.6 μm) of the photolithography device in a process of fabricating the correction structure 3 through a photolithography technique, namely, a width of the opposite edges adjacent to the first gap $G_1$ may be smaller than or equal to the alignment accuracy of the photolithography device.

Figure 4:
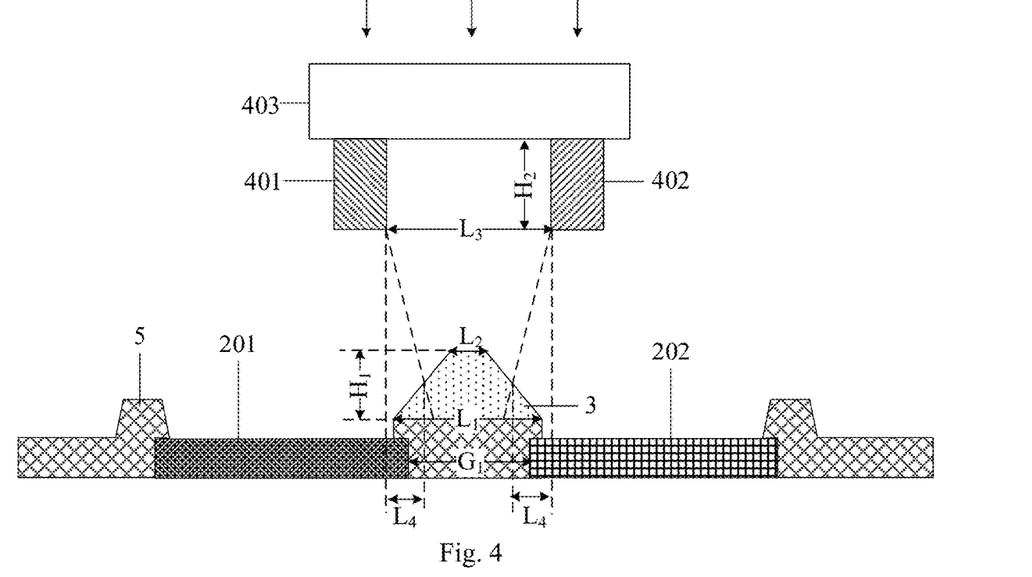
FIG. 4 is a schematic diagram of sizes of correction structures 3 in the driving backplane shown in FIG. 1.

At the moment, as shown in FIG. 4, in a direction orienting from the first connection electrode 201 to the second connection electrode 202, a length $L_1$ of a bottom edge of a section, perpendicular to the base substrate 1, of the each of the correction structures 3 is smaller than or equal to a sum of a doubled alignment accuracy of the photolithography device and the first gap $G_1$, namely, $L_1 \leq 2\lambda + G_1$. Besides, in order to guarantee that the first electrode 401 and the second electrode 402 included in the micro-LED 4 may slide down onto the first connection electrode 201 and the second connection electrode 202 from the slope surface of the correction structure 3 when falling offset occurs thereto, as shown in FIG. 4, a length $L_2$ of a top edge of the section, perpendicular to the base substrate 1, of the each of the correction structures 3 may be smaller than or equal to a difference value of a distance $L_3$ between the first electrode 401 and the second electrode 402 and a doubled maximum offset $L_4$ of falling, namely, $L_2 \leq L_3 - 2L_4$. Besides, when the first electrode 401 and the second electrode 402 are generally located on the same side as a light-emitting portion 403 included in the micro-LED 4, in order to guarantee that the first electrode 401 and the second electrode 402 may be in full contact with the first connection electrode 201 and the second connection electrode 202, as shown in FIG. 4, a height of the first electrode 401 is equal to a height of the second electrode 402, both of which are height $H_2$, and in a direction perpendicular to the base substrate 1, a height $H_1$ of each of the correction structures 3 may be smaller than or equal to the height $H_2$ of the first electrode 401 and the height $H_1$ of each of the correction structures 3 may be smaller than or equal to the height $H_2$ of the second electrode 402.

In some embodiments, when a size of the micro-LED 4 is, for example, 35 μm*25 μm, the distance $L_3$ between the first electrode 401 and the second electrode 402 is, for example, 10 μm, the height $H_2$ of the first electrode 401 and the height $H_2$ of the second electrode 402 are 2 μm, the maximum offset $L_4$ between the position of the micro-LED 4 lifted off from the growth substrate or the middle carrier substrate and transferred to the driving backplane and the ideal falling point is generally about 3 μm (e.g., 3.5 μm), the alignment accuracy λ of the photolithography device is 0.6 μm, the first gap $G_1$ between the first electrode 401 and the second electrode 402 is 6 µm, and the length $L_1$ of the bottom edge of the section, perpendicular to the base substrate 1, of each of the correction structures 3 is smaller than or equal to 7.2 µm (namely, $L_1 \leq 2\lambda + G_1$, wherein $2\lambda + G_1 = 2*0.6$ µm+6 µm=7.2 µm), specifically, 7.2 µm; the length $L_2$ of the top edge is smaller than or equal to 3 µm (namely, $L_2 \leq L_3 - 2L$ wherein, $L_3 - 2L_4 10$ µm-2*3.5 µm=3 µm), specifically, 2 µm or 1 µm; and the height $H_1$ is not larger than 2 µm (namely, $H_1$ is smaller than or equal to the height $H_2$ of the first electrode 401 and the second electrode 402, wherein $H_2$ is 2 µm), specifically, 1 µm.

During specific implementation, the above driving backplane provided by the embodiments of the present disclosure, as shown in FIG. 1 and FIG. 3, may further include: an insulation layer 5 located between a layer where the plurality of correction structures 3 are arranged and the layer where the plurality of connection electrode groups 2 are arranged.

The insulation layer 5 is provided with a plurality of openings, and an orthographic projection, on the base substrate, of each of the openings is located in an orthographic projection of the first connection electrode 201 and an orthographic projection of the second connection electrode 202. For example, as shown in the FIG. 1, there are two openings, an orthographic projection, on the base substrate, of an opening on the left may locate in the orthographic projection of the first connection electrode 201, and an orthographic projection, on the base substrate, of an opening on the right may locate in the orthographic projection of the second connection electrode 202.

In the process of fabricating each of the correction structures 3, the surface of the first connection electrode 201 and the surface of the second connection electrode 202 may be oxidized, an electric conductivity of the first connection electrode 201 and the second connection electrode 202 is affected, thus the insulation layer 5 may cover the first connection electrode 201 and the second connection electrode 202 firstly, then fabrication of the correction structures 3 may be completed under protection of the insulation layer 5, then a holing technique is performed on the insulation layer 5, and thus the first connection electrode 201 and the second connection electrode 202 are exposed.

Figure 5:
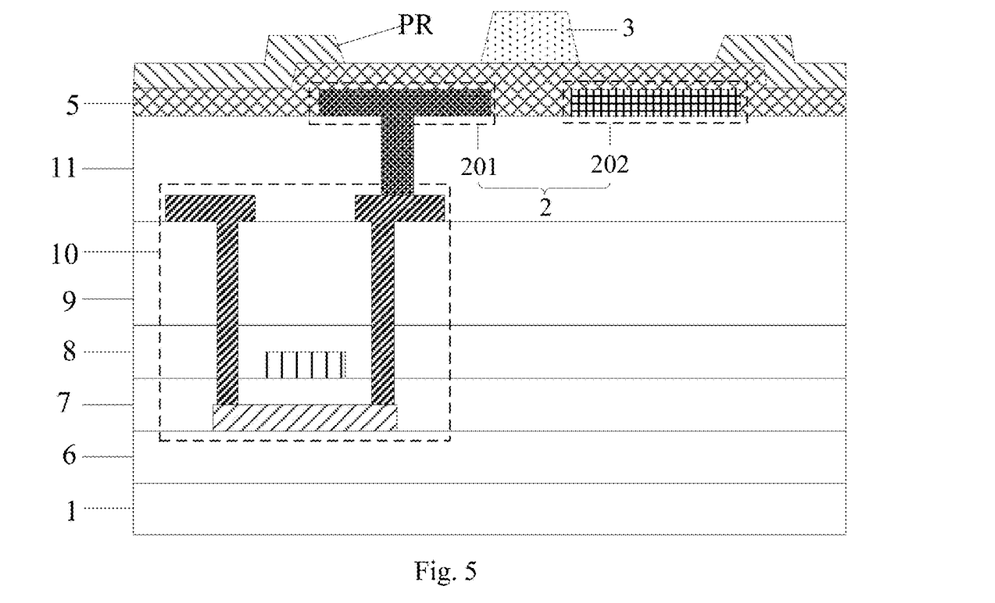
FIG. 5 is a schematic diagram of a mask of an insulation layer included in the driving backplane shown in FIG. 1.
Figure 6:
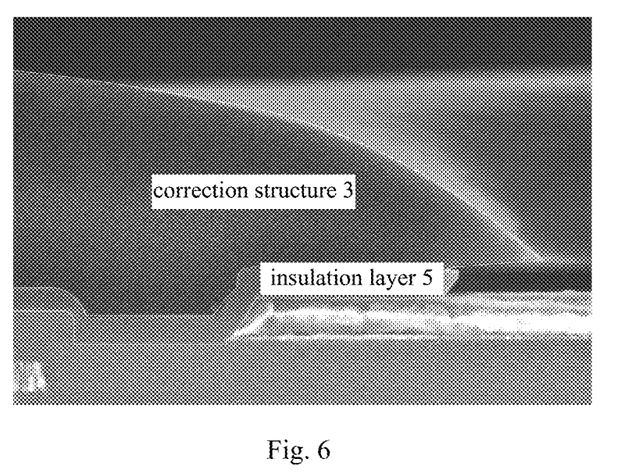
FIG. 6 is a scanning electron microscope graph of a correction structure and an insulation layer included in the driving backplane shown in FIG. 1 at a first gap.

During specific implementation, in the above driving backplane provided by the embodiments of the present disclosure, holing of the insulation layer 5 may be achieved by adopting the correction structures 3 as a shield at the first gap $G_1$ and adopting photoresist (PR) as a shield at the second group of opposite edges of the second connection electrode 202 and a second gap $G_2$ between two adjacent connection electrode groups 2 of the plurality of the connection electrode groups 2, as shown in FIG. 5. After the insulation layer 5 is holed, an orthographic projection of the insulation layer 5 at the first gap $G_1$ is located in the orthographic projection of the correction structure 3, as shown in FIG. 3 and FIG. 6, that is, the orthographic projection of the correction structure 3 covers the orthographic projection of the insulation layer 5 at the first gap $G_1$.

In other words, the insulation layer 5 does not exist independently at the opposite edges adjacent to the first gap $G_1$, so that the first electrode 401 and the second electrode 402 may correspondingly fall onto the surface of the first connection electrode 201 and the surface of the second connection electrode 202 from the slope surfaces of the correction structures 3 in a subsequent correcting process of the micro-LED 4 to form good contact.

During specific implementation, in the above driving backplane provided by the embodiments of the present disclosure, as shown in FIG. 2, the plurality of correction structures 3 may be located between the base substrate 1 and the layer where the plurality of connection electrode groups 2 are arranged.

The first connection electrode 201 and the second connection electrode 202 of one of the connection electrode groups 2 are arranged on the slope surfaces of the two adjacent correction structures 3 of the correction structures at the first gap $G_1$ respectively.

The orthographic projection of the each of the correction structures 3 on the base substrate 1 is coincide with an orthographic projection of the second group of opposite edges, formed by the edge, far away from the first gap $G_1$, of the first connection electrode 201 and the edge, far away from the first gap $G_1$, of the second connection electrode 202, and an orthographic projection of the second gap $G_2$ between the two adjacent connection electrode groups 2.

Correspondingly, in the above driving backplane provided by the embodiments of the present disclosure, as shown in FIG. 2, the first electrode 401 and the second electrode 402 corresponding to the first connection electrode 201 and the second connection electrode 202 arranged on the slope surfaces of the two adjacent correction structures 3 may be arranged on opposite sides of the light-emitting portion 403 included in the micro-LED 4 respectively, that is, the opposite sides of the light-emitting portion 403 include a first side closed to the first connection electrode 201 and a second side closed to the second connection electrode 201, the first connection electrode 201 is arranged on the first side of the light-emitting portion 403, and the second connection electrode 202 is arranged on the second side of the light-emitting portion 403. Further, a first included angle $\lambda_1$ between the first side and the base substrate 1 is an acute angle, a second include angle $\lambda_2$ between the second side and the base substrate 1 is an acute angle.

Optionally, the first included angle $\lambda_1$ is equal to the second included angle $\lambda_2$.

Optionally, as shown in FIG. 2, a first slope angle $\theta_1$ of a side, close to the first connection electrode 201, of correction structure 3 is equal to the first included angle $\lambda_1$, and a second slope angle $\theta_2$ of a side, close to the second connection electrode 202, of correction structure 3 is equal to the second included angle $\lambda_2$ and may be, for example, larger than or equal to 15° and smaller than 90°, specifically larger than or equal to 30° and smaller than or equal to 70°, for example, $\theta_1 = \lambda_1 = 32°$, $\theta_2 = \lambda_2 = 52°$.

Optionally, the first slope angle $\theta_1$ can be equal to the second slope angle $\theta_2$, the first included angle $\lambda_1$ can be equal to the second included angle $\lambda_2$, and the slope angle $\theta_1$ can be equal to the first included angle $\lambda_1$, that is, $\theta_1 = \lambda_1 = \theta_2 = \lambda_2$, for example, 32°. In other words, in some embodiments, the slope angles of the correction structure 3 at the one group of opposite edges are equal to the first included angle, and the slope angle of the correction structure 3 at the one group of opposite edges are equal to the second included angle.

Optionally, in the above driving backplane provided by the embodiments of the present disclosure, in order to guarantee that the first electrode 401 is in direct contact with the first connection electrode 201 and the second electrode 402 is in direct contact with the second connection electrode 202, as shown in FIG. 2, in the direction perpendicular to the base substrate 1, the height $H_1$ of each of the correction structures 3 may be equal to the height $H_3$ of the light-emitting portion 403.

Figure 7:
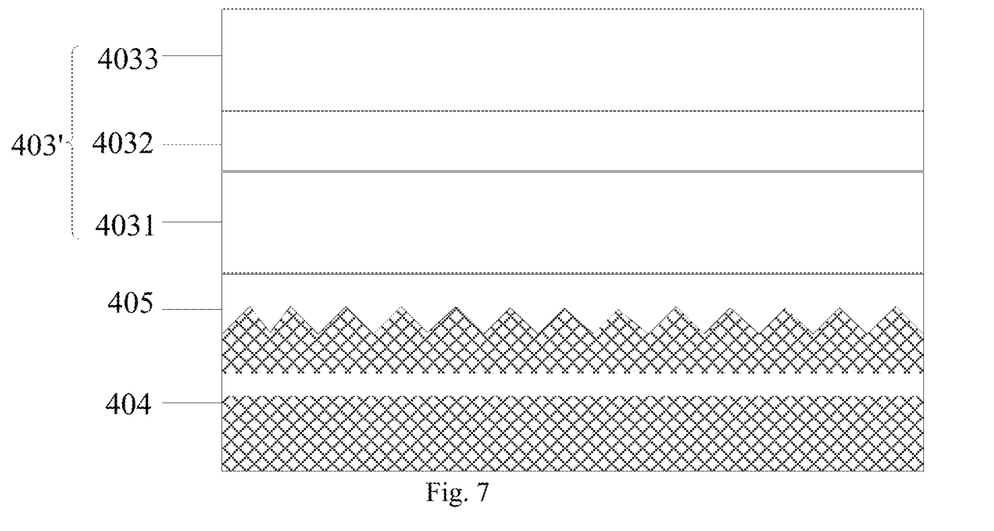
FIG. 7 to FIG. 20 are schematic structural diagrams of a micro-LED included in FIG. 2 in a fabrication process respectively.

As shown in FIG. 7, a fabrication process of the micro-LED 4 may specifically include the following steps.

First step: a growth substrate 404 is provided, and a first buffer layer 405 and an epitaxial layer 403' are formed on the growth substrate 404 in sequence, wherein the epitaxial layer 403' includes: a first semiconductor layer 4031, a multiple quantum well layer 4032 and a second semiconductor layer 4033 arranged in sequence in a stacked mode. In some embodiments, when the micro-LED 4 is a red micro-LED R, a material of the growth substrate 404 is GaP or GaAs, a material of the first buffer layer 405 is GaP, a material of the first semiconductor layer 4031 is p-AgP, a material of the multiple quantum well layer 4032 is AlInGaP, and a material of the second semiconductor layer 4033 is n-GaP. When the micro-LED 4 is a green micro-LED G and a blue micro-LED B, the material of the growth substrate 404 is aluminium oxide or SiC, the material of the first buffer layer 405 is GaN, the material of the first semiconductor layer 4031 is p-GaN, the material of the multiple quantum well layer 4032 is AlInGaN, and the material of the second semiconductor layer 4033 is n-GaN.

Figure 8:
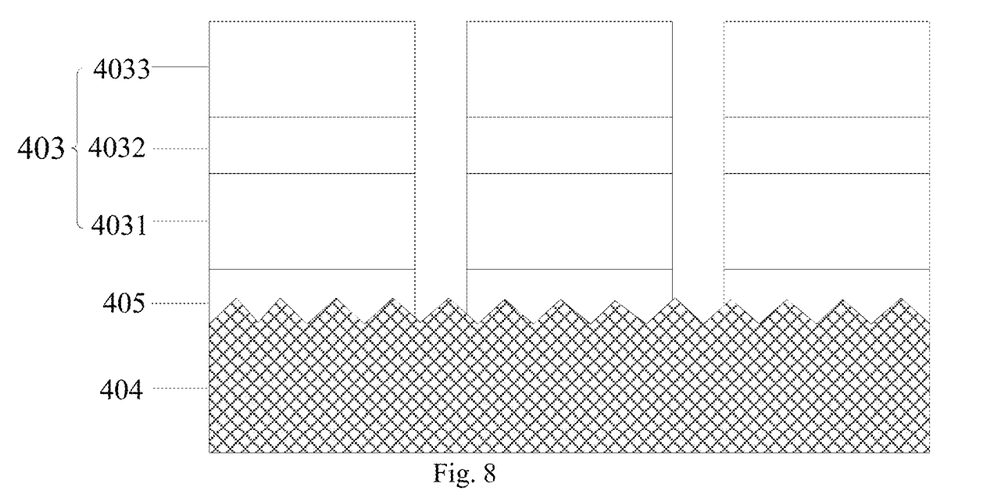
Figure 9:
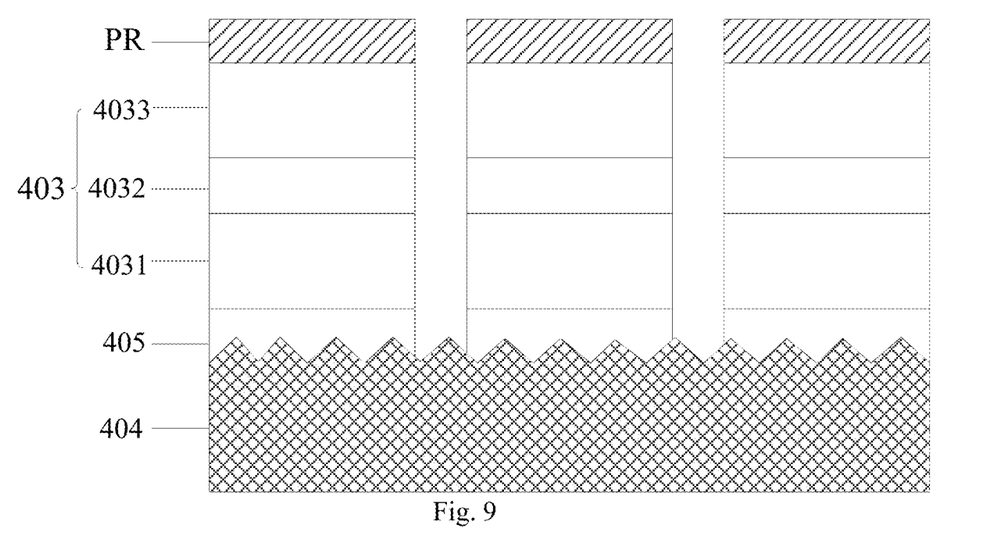
Figure 10:
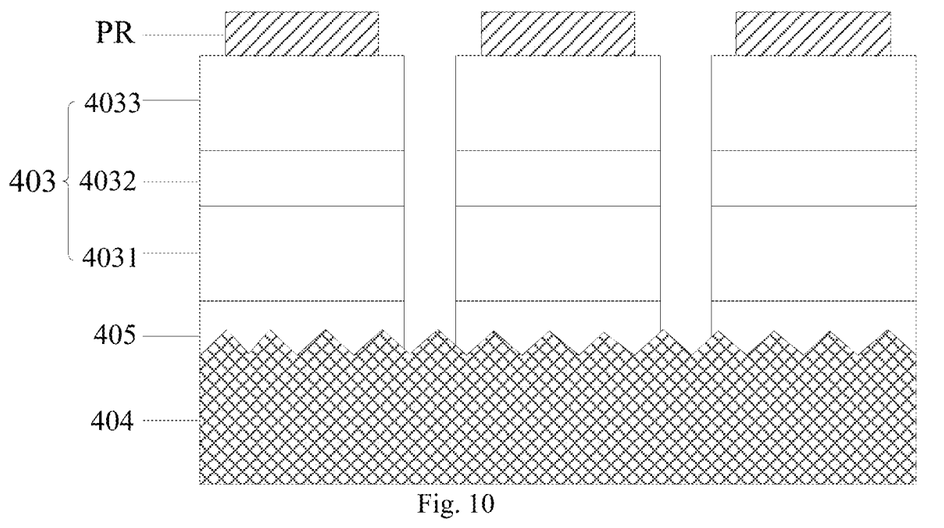
Figure 11:
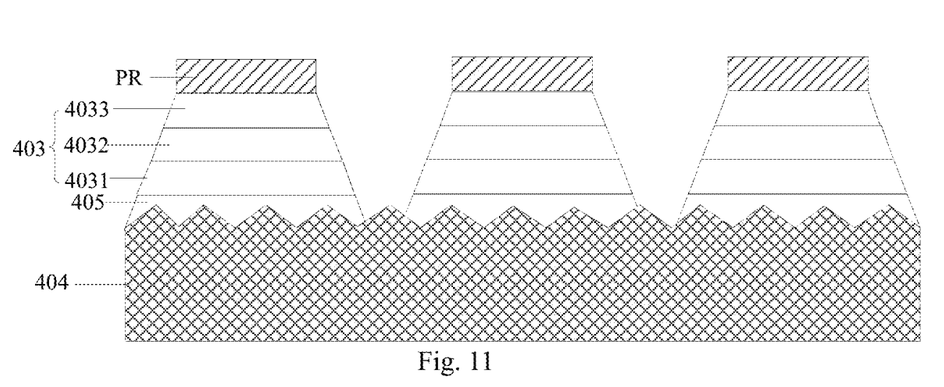
Figure 12:
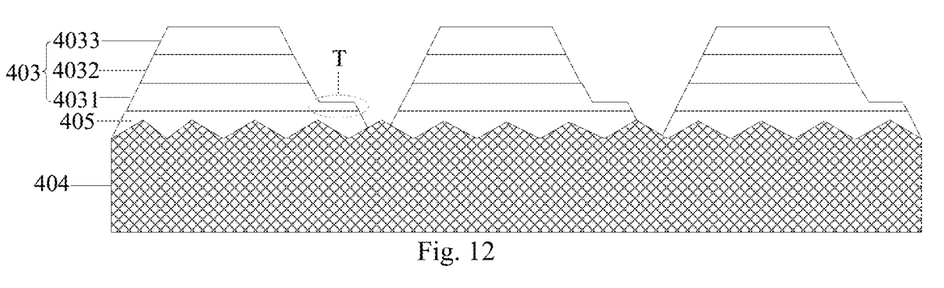

Second step: the epitaxial layer 403' is cut into a plurality of light-emitting portions 403, specifically, at least one of the PR, silicon oxide ($SiO_2$) and silicon nitride (SiNx) is used as a shield layer, etching is performed to reach a layer with a sapphire substrate 404 through a mask and a dry etching technique (e.g., an inductively coupled plasma (ICP)), and thus the light-emitting portions 403 with a determined size may be obtained, as shown in FIG. 8.

Third step: at least one of the PR, silicon oxide ($SiO_2$) and silicon nitride (SiNx) is used as the shield layer, and a carrying table surface T is formed on the first semiconductor layer 4031 included in each of the light-emitting portions 403 through the mask and the dry etching technique, as shown in FIG. 9 to FIG. 12.

Figure 13:
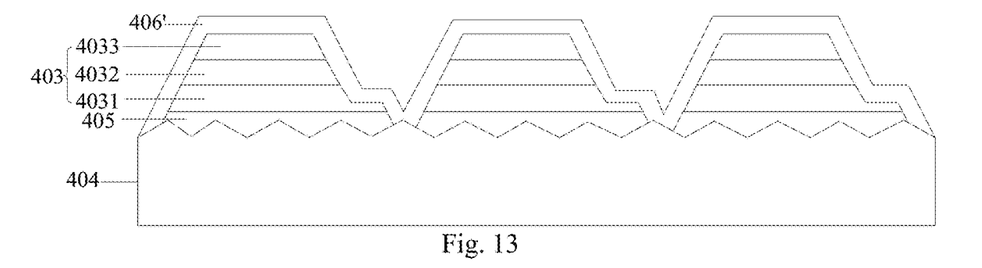
Figure 14:
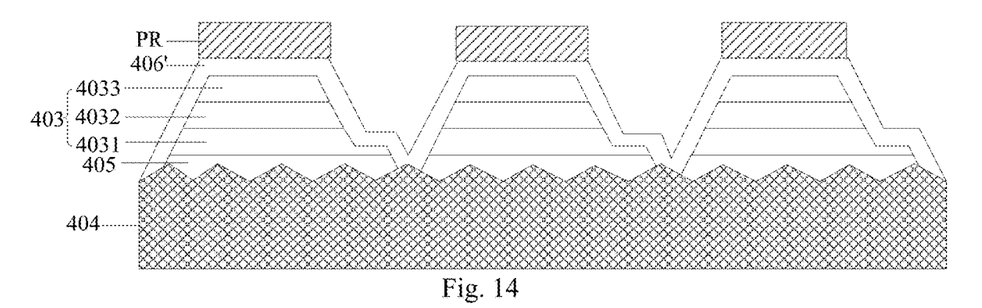
Figure 15:
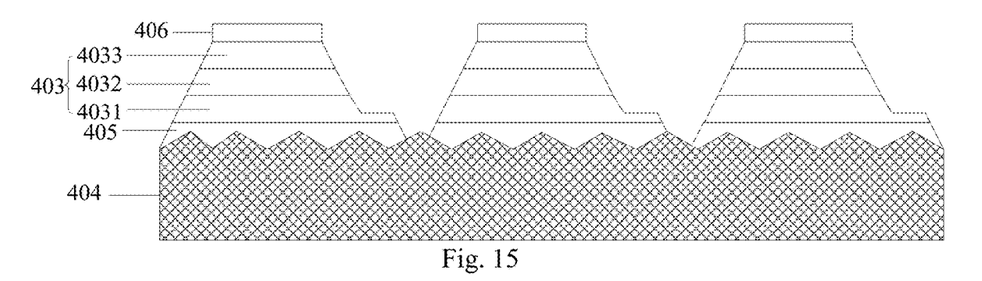

Fourth step: an indium tin oxide layer 406' is formed on a whole surface of the second semiconductor layer 4033, the PR is used as the shield layer, and the indium tin oxide layer 406' is patterned through the mask and a wet etching technique so as to form a second contact electrode 406, as shown in FIG. 13 to FIG. 15.

Figure 16:
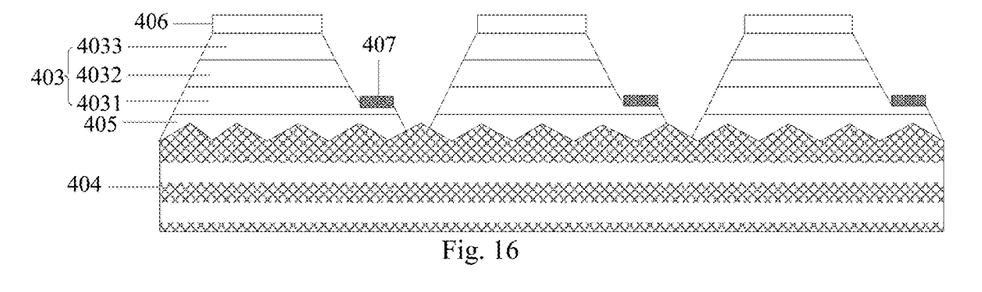

Fifth step: a conductive layer is formed on a whole surface of the second contact electrode 406, then the photoresist is used as the shield layer, the conductive layer is patterned through the mask, the etching technique and a liftoff technique, and a first contact electrode 407 is formed on the carrying table surface T, as shown in FIG. 16.

Figure 17:
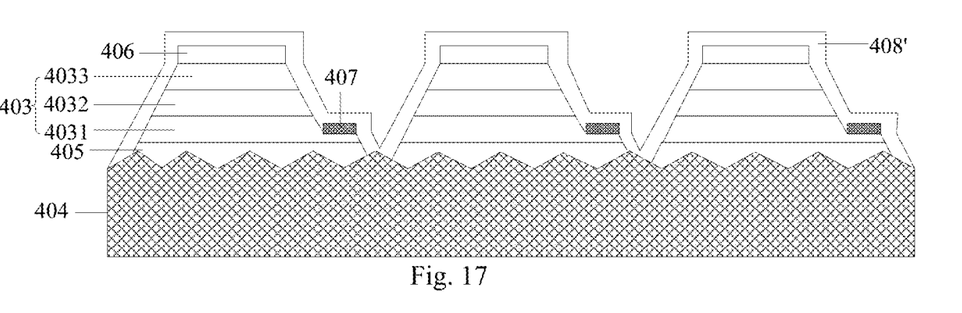
Figure 18:
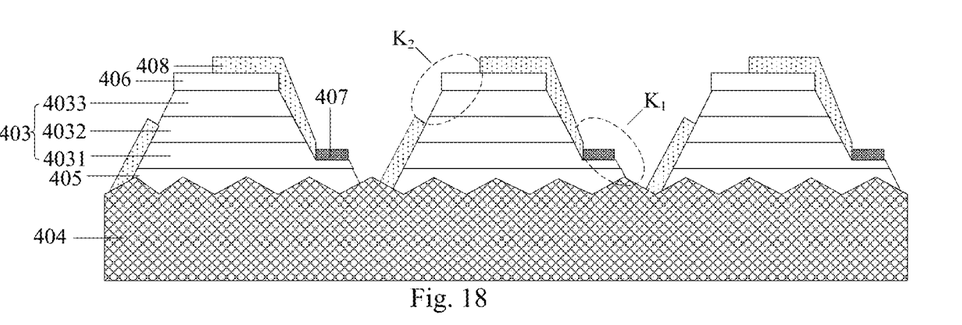

Sixth step: an inorganic insulation layer 408' is formed through at least one of silicon oxide ($SiO_2$) and silicon nitride (SiNx), and the inorganic insulation layer 408' is patterned to form a passivation layer 408, the passivation layer 408 includes a first opening $K_1$ and a second opening $K_2$ located on two sides of the light-emitting portion 403, the first opening $K_1$ is exposed out of the first contact electrode 407, and the second opening $K_2$ is exposed out of part of the second contact electrode 406 and the second semiconductor layer 4033, as shown in FIG. 17 and FIG. 18.

Figure 19:
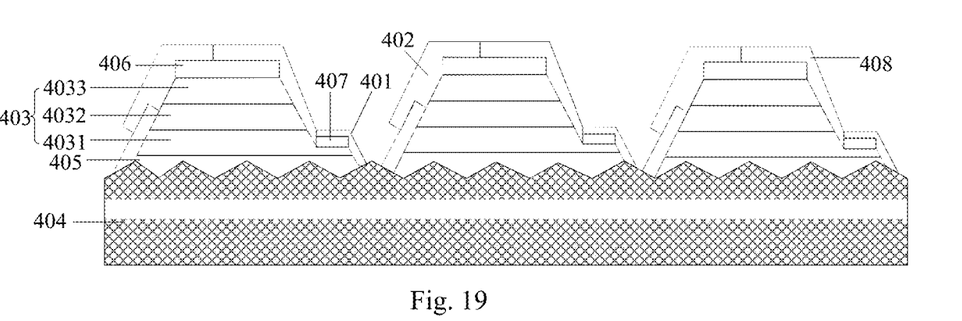

Seventh step: the first electrode 401 covering the first contact electrode 407 is formed at the first opening $K_1$, and meanwhile, the second electrode 402 in direct lap joint with the second contact electrode 406 is formed at the second opening $K_2$, as shown in FIG. 19.

Figure 20:
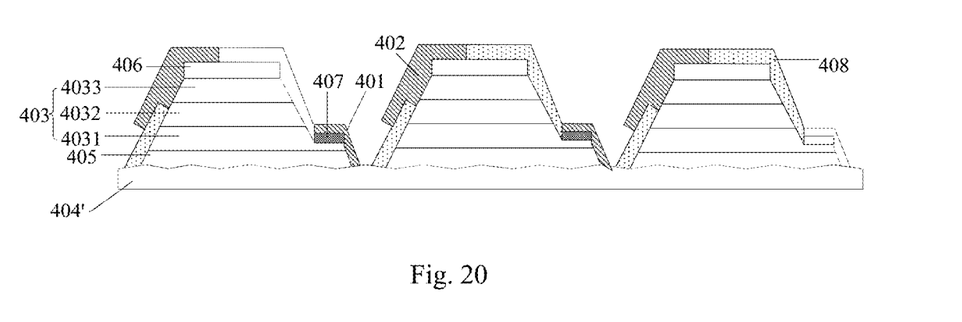

Eighth step: the sapphire substrate 404 and the first buffer layer 405 which has poor electrical property and many structure defects are lifted off through a laser liftoff technique, and a plurality of independent micro-LEDs 4 are obtained, as shown in FIG. 20.

Through the above steps, the micro-LEDs 4 shown in FIG. 2 may be obtained.

It needs to be noted that in a fabrication method provided by embodiments of the present disclosure, patterning techniques for forming each layer of structure may not only include part of or all technique processes such as deposition, photoresist coating, masking, exposure, developing, etching, photoresist liftoff, and the like, but also include other technique processes, specifically, formed patterns needing to be patterned in an actual fabrication process are as the criteria, which is not limited herein. For example, a postbaking technique may be further included after developing and before etching.

The deposition technique may be a chemical vapor deposition method, a plasma enhancing chemical vapor deposition method or a physical vapor deposition method and is not limited herein. The mask used in a masking technique may be a Half Tone Mask or a Single Slit Mask or a Gray Tone Mask and is not limited herein. Etching may be dry etching or wet etching and is not limited herein.

Optionally, the above driving backplane provided by the embodiments of the present disclosure, as shown in FIG. 1, may further include: a second buffer layer, a first gate insulating layer 7, a second gate insulating layer 8, an interlayer dielectric layer 9, a transistor 10 electrically connected with the first connection electrode 201, and a flat layer 11.

Based on the same inventive concept, embodiments of the present disclosure provide a display panel, including: a plurality of micro-LEDs, and the above driving backplane. Each of the plurality of micro-LEDs corresponds to each of a plurality of connection electrode groups. As a principle of solving problems of the display panel is similar to that of solving problems of the above driving backplane, implementation of the display panel provided by the embodiments of the present disclosure may be referred to implementation of the above driving backplane provided by the embodiments of the present disclosure, and repetitions are omitted herein.

Based on the same inventive concept, embodiments of the present disclosure further provide a display apparatus, including the above display panel provided by the embodiment of the present disclosure. The display apparatus may be: a mobile phone, a tablet PC, a TV, a display, a laptop, a digital photo frame, a navigator, a smartwatch, a fitness wristband, a personal digital assistant and any other products or members with a displaying function. Other essential components of the display apparatus are understood by those ordinarily skilled in the art and will neither be detailed here nor limit the present disclosure. Besides, as a principle of solving problems of the display apparatus is similar to that of solving problems of the above display panel, implementation of the display apparatus may be referred to the embodiments of the display panel, and repetitions are omitted.

According to the above driving backplane, the above display panel and the above display apparatus provided by the embodiments of the present disclosure, the driving backplane includes: the base substrate; the plurality of connection electrode groups disposed on the base substrate and the plurality of correction structures disposed on the base substrate; and each connection electrode groups includes: the first connection electrode and the second connection electrode, the first connection electrode and the second connection electrode are arranged on the same layer; the first gap is formed between the first connection electrode and the second connection electrode, and a first group of the opposite edges includes: the edge, close to the first gap, of the first connection electrode and the edge, close to the first gap, of the second connection electrode, the second group of the opposite edges includes: the edge, far away from the first gap, of the first connection electrode and the edge, far away from the first gap, of the second connection electrode; and the orthographic projection of each of the correction structures on the base substrate overlaps with the orthographic projection of one group of opposite edges the one group of opposite edges is the first group of opposite edges or the second group of opposite edges, the slope angles of the each of the correction structures at the one group of opposite edges are acute angles, the each of the correction structures is configured to limit the first electrode and the second electrode of a micro-LED to the surface of the first connection electrode and the surface of the second connection electrode included in the each of the connection electrode groups respectively.

The correction structures with the acute angle slopes are arranged at the opposite edges of the first connection electrodes and the second connection electrodes. Thus, on the one hand, the micro-LED may adopt the slopes of the correction structures in the free falling process to compensate alignment accuracy of a mechanical photolithography device, and the first electrode and the second electrode included in the micro-LED are guided to the surface of the first connection electrode and the surface of the second connection electrode included in one of the connection electrode groups respectively; besides, if the first electrode and the second electrode included in the micro-LED has angle offset in the plane direction of the driving backplane, the correction structures may enable the first electrode and the second electrode included in the micro-LED to be corrected in angle along the slope edges of the correction structures; and on the other hand, after the first electrode and the second electrode included in the micro-LED fall onto the driving backplane, the driving backplane may be moved in a vertical direction in contact with the correction structures, and at the moment, because of the blocking effect of the correction structure, it may be guaranteed that the first electrode and the second electrode included in the micro-LED do not deviate. Therefore, the transferring yield of the micro-LED is effectively improved.

Apparently, those skilled in the art may make various changes and modifications for this disclosure without departing from the scope of the present disclosure. In this case, if these changes and modifications of the present disclosure fall in the scope of claims and their equivalents, the present disclosure also intends to include these changes and modifications.

What is claimed is:

1. A driving backplane, comprising:
   a base substrate;
   a plurality of connection electrode groups disposed on the base substrate; and
   a plurality of correction structures disposed on the base substrate;
   wherein each of the connection electrode groups comprises:
     a first connection electrode; and
     a second connection electrode;
     wherein the first connection electrode and the second connection electrode are arranged on a same layer;
     a first gap is formed between the first connection electrode and the second connection electrode;
     an edge of the first connection electrode in contact with the first gap and an edge of the second connection electrode in contact with the first gap form a first group of opposite edges;
     an edge of the first connection electrode away from the first gap and an edge of the second electrode away from the first gap form a second group of opposite edges;
   wherein an orthographic projection, on the base substrate, of each of the correction structures overlaps with an orthographic projection, on the base substrate, of one group of opposite edges, wherein the one group of opposite edges is the first group of opposite edges or the second group of opposite edges;
   slope angles of the each of the correction structures at the one group of opposite edges are acute angles; and
   the each of the correction structures is configured to limit a first electrode and a second electrode of a micro-LED to a surface of the first connection electrode and a surface of the second connection electrode comprised in the each of the connection electrode groups respectively;
   wherein the plurality of correction structures are on a side, facing away from the base substrate, of a layer where the plurality of connection electrode groups are arranged; and
   the orthographic projection, on the base substrate, of the each of the correction structures is coincide with an orthographic projection, on the base substrate, of the first group of opposite edges and an orthographic projection, on the base substrate, of the first gap;
   wherein the driving backplane further comprises:
   an insulation layer disposed between a layer where the plurality of correction structures are arranged and the layer where the plurality of connection electrode groups are arranged; wherein
   the insulation layer is provided with a plurality of openings, and an orthographic projection, on the base substrate, of each of the openings is in an orthographic projection of the first connection electrode and an orthographic projection of the second connection electrode.

2. The driving backplane according to claim 1, wherein the first connection electrode and the second connection electrode are arranged at intervals along a first direction, the first direction is a direction orienting from the first connection electrode to the second connection electrode; the correction structure has a first cross section on a plane perpendicular to the base substrate and parallel to the first direction, and a size of the first cross section satisfies:
   $L_1 \leq 2\lambda + G_1$; wherein $L_1$ represents a length of a whole bottom edge of the first cross section, $\lambda$ represents an alignment accuracy of a standard photolithography device, and $G_1$ represents a length of the first gap in the first direction; and
   $L_2 \leq L_3 - 2L_4$; wherein $L_2$ represents a length of a whole top edge of the first cross section, and $L_3$ represents a distance between the first connection electrode and the second connection electrode in the first direction, and $L_4$ represents a distance, in the first direction, between an actual position where the micro-LED is transferred to the driving backplane and a target position; and
   wherein heights of the first electrode and the second electrode satisfy a following relationship with a height of the correction structure:

$H_1 \le H_2$; wherein $H_1$ represents the heights of the first electrode and the second electrode, and $H_2$ represents the height of the correction structure.

3. The driving backplane according to claim 1, wherein the orthographic projection, on the base substrate, of the each of the correction structures covers an orthographic projection, on the base substrate, of the insulation layer at the first gap.

4. The driving backplane according to claim 1, wherein the plurality of correction structures are between the base substrate and a layer where the plurality of connection electrode groups is arranged;
the first connection electrode and the second connection electrode of one of the connection electrode groups are arranged on slope surfaces of two adjacent correction structures of the correction structures at the first gap respectively; and
the orthographic projection, on the base substrate, of the each of the correction structures is coincide with an orthographic projection of the second group of opposite edges and an orthographic projection of a second gap between the two adjacent connection electrode groups.

5. The driving backplane according to claim 4, wherein the first electrode is arranged on a first side, close to the first connection electrode, of a light-emitting portion comprised in the micro-LED, and the second electrode is arranged on a second side, close to the second connection electrode, of the light-emitting portion;
a first included angle between the first side and the base substrate is an acute angle, and a second include angle between the second side and the base substrate is an acute angle.

6. The driving backplane according to claim 5, wherein the first included angle is equal to the second included angle; and
the slope angles of the correction structures at the one group of the opposite edges are equal to the first included angle and the second included angle.

7. The driving backplane according to claim 5, wherein in a direction perpendicular to the base substrate, heights of the correction structures are equal to a height of the light-emitting portion.

8. The driving backplane according to claim 1, wherein the slope angles of the each of the correction structures at the one group of the opposite edges are larger than or equal to 15° and smaller than 90°.

9. A display panel, comprising:
a plurality of micro-LEDs, and
a driving backplane;
wherein the driving backplane comprises:
a base substrate;
a plurality of connection electrode groups disposed on the base substrate; and
a plurality of correction structures disposed on the base substrate,
wherein each of the plurality of connection electrode groups comprises:
a first connection electrode, and
a second connection electrode;
wherein the first connection electrode and the second electrode are arranged on a same layer;
a first gap is formed between the first connection electrode and the second connection electrode;
an edge of the first connection electrode in contact with the first gap and an edge of the second connection electrode in contact with the first gap form a first group of opposite edges;
an edge of the first connection electrode away from the first gap and an edge of the second electrode away from the first gap form a second group of opposite edges;
wherein an orthographic projection, on the base substrate, of each of the correction structures overlaps with an orthographic projection, on the base substrate, of one group of opposite edges, wherein the one group of opposite edges is the first group of opposite edges or the second group of opposite edges;
slope angles of the each of the correction structures at the one group of opposite edges are acute angles, and
the each of the correction structures is configured to limit a first electrode and a second electrode of a micro-LED to a surface of the first connection electrode and a surface of the second connection electrode comprised in the each of the connection electrode groups respectively;
wherein each of the plurality of micro-LEDs corresponds to each of the plurality of connection electrode groups respectively;
wherein the plurality of correction structures are on a side, facing away from the base substrate, of a layer where the plurality of connection electrode groups are arranged; and
the orthographic projection, on the base substrate, of the each of the correction structures is coincide with an orthographic projection, on the base substrate, of the first group of opposite edges and an orthographic projection, on the base substrate of the first gap;
wherein the driving backplane further comprises:
an insulation layer disposed between a layer where the plurality of correction structures are arranged and the layer where the plurality of connection electrode groups are arranged; wherein
the insulation layer is provided with a plurality of openings, and an orthographic projection, on the base substrate, of each of the openings is located in an orthographic projection of the first connection electrode and an orthographic projection of the second connection electrode.

10. The display panel according to claim 9, wherein the first connection electrode and the second connection electrode are arranged at intervals along a first direction, the first direction is a direction orienting from the first connection electrode to the second connection electrode; the correction structure has a first cross section on a plane perpendicular to the base substrate and parallel to the first direction, and a size of the first cross section satisfies:
$L_1 \le 2\lambda + G_1$; wherein $L_1$ represents a length of a whole bottom edge of the first cross section, $\lambda$ represents an alignment accuracy of a standard photolithography device, and $G_1$ represents a length of the first gap in the first direction; and
$L_2 \le L_3 - 2L_4$; wherein $L_2$ represents a length of a whole top edge of the first cross section, and $L_3$ represents a distance between the first connection electrode and the second connection electrode in the first direction, and $L_4$ represents a distance, in the first direction, between an actual position where the micro-LED is transferred to the driving backplane and a target position; and
wherein heights of the first electrode and the second electrode satisfy a following relationship with a height of the correction structure:

$H_1 \leq H_2$; wherein $H_1$ represents the heights of the first electrode and the second electrode, and $H_2$ represents the height of the correction structure.

11. The display panel according to claim 9, wherein the orthographic projection, on the base substrate, of the each of the correction structures covers an orthographic projection, on the base substrate, of the insulation layer at the first gap.

12. The display panel according to claim 9, wherein the plurality of correction structures are between the base substrate and a layer where the plurality of connection electrode groups is arranged;

the first connection electrode and the second connection electrode of one of the connection electrode groups are arranged on slope surfaces of two adjacent correction structures of the plurality of correction structures at the first gap respectively; and the orthographic projection, on the base substrate, of the each of the correction structures is coincide with an orthographic projection of the second group of opposite edges and an orthographic projection of a second gap between the two adjacent connection electrode groups.

13. The display panel according to claim 12, wherein the first electrode is arranged on a first side, close to the first connection electrode, of a light-emitting portion comprised in the micro-LED, and the second electrode is arranged on a second side, close to the second connection electrode, of the light-emitting portion;

a first included angle between the first side and the base substrate is an acute angle, and a second include angle between the second side and the base substrate is an acute angle.

14. The display panel according to claim 13, wherein in a direction perpendicular to the base substrate, heights of the correction structures are equal to a height of the light-emitting portion.

15. The display panel according to claim 9, wherein the slope angles of the each of the correction structures at the one group of the opposite edges are larger than or equal to 15° and smaller than 90°.

16. A display apparatus, comprising the display panel according to claim 9.

* * * * *